United States Patent [19]
America

[11] Patent Number: 5,585,283
[45] Date of Patent: Dec. 17, 1996

[54] METHOD FOR ESTABLISHING AN ELECTRICAL FIELD BY THINNING AN IMPLANTED REGION AT A SURFACE OF A SEMICONDUCTOR DEVICE

[75] Inventor: William America, Newtown, Conn.

[73] Assignee: Hughes Aircraft Company, Los Angeles, Calif.

[21] Appl. No.: 444,617

[22] Filed: May 19, 1995

Related U.S. Application Data

[60] Continuation of Ser. No. 249,401, May 26, 1994, abandoned, which is a division of Ser. No. 906,624, Jun. 30, 1992, Pat. No. 5,362,978, which is a continuation of Ser. No. 670,762, Mar. 18, 1991, abandoned.

[51] Int. Cl.$^6$ ................................................ H01L 21/265
[52] U.S. Cl. ............................ 437/20; 437/974; 437/53
[58] Field of Search ........................... 257/222, 223, 257/225, 227, 228, 229; 250/208.1; 358/213.3; 437/53, 974, 20, 26, 86, 173, 225, DIG. 153

[56] References Cited

U.S. PATENT DOCUMENTS

| | | | |
|---|---|---|---|
| 4,321,747 | 3/1987 | Takemura et al. | 437/974 |
| 4,968,634 | 11/1990 | Kuhlmann | 437/20 |
| 5,134,274 | 7/1992 | Poole et al. | 250/208.1 |
| 5,162,241 | 11/1992 | Mori et al. | 437/10 |
| 5,162,251 | 11/1992 | Poole et al. | 437/53 |
| 5,252,498 | 10/1993 | Yamazaki | 437/20 |
| 5,270,221 | 12/1993 | Garcia et al. | 437/974 |
| 5,362,978 | 11/1994 | America | 257/228 |

*Primary Examiner*—Tom Thomas
*Assistant Examiner*—S. Mulpuri
*Attorney, Agent, or Firm*—W. C. Schubert; W. K. Denson-Low

[57] ABSTRACT

A thinned backside illuminated charge-coupled imaging device has improved quantum efficiency by providing a sharp ion implant distribution profile (20) disposed at the rear surface (22) of the device. The sharp ion implant distribution profile (20) is formed using ion implantation at a beam energy potential of between 100–150 keV, which forms an electric field beneath the surface of the device. The ion distribution profile (20) is brought to the surface (22) of the device by removing silicon (18) from the rear surface (22), using a polishing technique wherein the device is lapped with colloidal silica abrasive to controllably remove silicon down to the level of the ion implantation profile (20).

9 Claims, 1 Drawing Sheet

METHOD FOR ESTABLISHING AN ELECTRICAL FIELD BY THINNING AN IMPLANTED REGION AT A SURFACE OF A SEMICONDUCTOR DEVICE

This is a continuation application of Ser. No. 249,401, now abandoned filed May 26, 1994, which is a division of application Ser. No. 07/906,624, U.S. Pat. No. 5,362,978 filed Jun. 30, 1992, which is a continuation of Ser. No. 670,762 filed Mar. 18, 1991 and now abandoned.

BACKGROUND OF THE INVENTION

1. Field of the Invention

The present invention relates to the preparation of semiconductor devices, and more particularly to a method used to establish an electrical field near a surface of a semiconductor device, and in particular, a charge-coupled imaging device.

2. Description of the Prior Art

Charge-coupled devices are typically made of silicon and are used as solid-state imagers by taking advantage of the properties of a silicon crystal lattice. In the crystalline form, each atom of silicon is covalently bonded to its neighbor. Energy greater than the energy gap of about 1.1 V is required to break a bond and create an electron hole pair. Incident electromagnetic radiation in the form of photons of wavelength shorter than 1 um can break the bonds and generate electron hole pairs.

The wavelength of incoming light and the photon absorption depth are directly related, the shorter the wavelength, the shorter the penetration depth into the silicon. Silicon becomes transparent at a wavelength of approximately 1100 nm and is essentially opaque to light at wavelengths shorter than 400 nm. High energy particles, X-rays and cosmic rays can break many thousands of bonds; therefore, excessive exposure to these can cause damage to the crystal lattice. Bonds can also be broken by thermal agitation. At room temperature, approximately 50 bonds per second per $um^3$ are broken and recombined on a continuous basis. The rate of electron hole pair generation due to thermal energy is highly temperature-dependent and can be reduced arbitrarily through cooling.

In order to measure the electronic charge produced by incident photons, it was required to provide a means for collecting this charge. Thus, the potential well concept was developed, wherein a thin layer of silicon dioxide is grown on a section of silicon, and a conductive gate structure is formed over the oxide. The gate structure is formed in an array of columns and rows, thus making it possible, by applying a positive electrical potential to various gate elements, to create depletion regions where free electrons generated by the incoming photons can be stored.

By controlling the electrical potential applied to adjacent gates, the depletion region, or well, containing the free electrons can be caused to migrate along a column or row, so that the signal may eventually be output at the edge of the array.

Typically, the gate structure is arranged with multiple phases, particularly three phases, so that the potential wells may be easily migrated through the silicon to an output device.

In reality, the wells and the migration of the wells is not carried out along the surface of the silicon-silicon dioxide interface, but takes place in a buried channel below the surface. The buried channel is free of interference from interface states and thus assures effective charge transfer from well to well. The operation of a charge-coupled device is somewhat analogous to that of a bucket brigade circuit commonly used to delay electrical signals.

Because the charge from the wells located far from an output amplifier must undergo hundreds of transfers, the charge transfer efficiency of a charge-coupled device is most important, as is the quantum efficiency and the spectral response. These considerations are particularly important when extremely low light levels are to be sensed.

Light normally enters the charge-coupled device by passing through the gates in the silicon dioxide layer. The gates are usually made of very thin polysilicon, which is reasonably transparent to long wavelengths but becomes opaque at wavelengths shorter than 400 nm. Thus, at short wavelengths, the gate structure attenuates incoming light.

In an effort to overcome this difficulty, it has become the practice to uniformly thin a charge-coupled device to a thickness of approximately 10 um, using acid etching techniques. Using a thinned charge-coupled device, it then becomes possible to focus an image on the backside of the charge-coupled device, where there is no gate structure that will attenuate the incoming light. Thinned charge-coupled devices exhibit high sensitivity to light from the soft X-ray to the near-infrared region of the spectrum.

FIG. 1A illustrates schematically a cross-section of a typical thick-bodied charge-coupled device. The device includes a silicon body 2, a silicon dioxide layer 4 and a gate array 6 formed on the silicon dioxide layer. Incoming light is illustrated by arrows 8 as illuminating a front side of the silicon 2. FIG. 1B illustrates a cross-section of a thinned charge-coupled device with light illuminating a backside. The thinned charge-coupled device, having a thickness of approximately 10 um, has improved quantum efficiency and UV spectral response.

In order to improve the quantum efficiency of the charge-coupled device, it is desirable that the free electrons accumulate in the buried channel near the front surface of the charge-coupled device under the gate structure. It has become the practice to develop an electronic field near the rear surface of the charge-coupled device to drive electrons towards the front pixel surface, so that the free electrons may be concentrated in the buried channel. This practice is also used with thinned charge-coupled devices and in such cases, the rear surface of the device is subjected to ion implantation of, for example, boron, followed by laser annealing for full implant activation.

One difficulty that has been encountered with this practice is that the boron concentration maximum is not at the rear surface of the charge-coupled device, but rather is buried below the surface at a depth ranging from 2000Å to over 5000Å. As a result, the rear surface of the silicon is at a different potential than the sub-surface silicon. This situation may not be undesirable for front-illuminated devices or for rear-illuminated devices for light in the visible spectrum, where photon penetration is greater than 5000Å. However, for rear-illuminated devices, as wavelengths become shorter, the penetration depths shorten, and the photo-electrons see a potential barrier and are essentially driven to the rear surface, as opposed to the front surface. As a result, the quantum efficiency of the device becomes exceedingly low.

To reduce this undesirable phenomenon, ion implantation is generally carried out at low ion beam energies equal to or slightly greater than 5 keV. Such low ion beam energies result in an implantation concentration maximum nearer to the rear surface as, for example, at approximately 1500Å. However, with low implantation energies, the ion distribution profile tends to be rather broad, and a good sharp implantation distribution is not realized. Further broadening of the distribution profile occurs when the implantation is laser activated into the silicon matrix.

Using such techniques, the sub-surface maximum is satisfactory for visible light, but becomes a major concern and results in loss of quantum efficiency as wavelengths become shorter and the photon penetration depths fall below 2000Å. When this occurs, the photo-electron sees a potential wall that results in reduced quantum efficiency.

The problem of generating an electrical field at a surface of semiconductor material is encountered in many other fields of endeavor. The problem is not limited to the preparation of charge-coupled imaging devices. In the preparation of solar cells, the same difficulty is realized.

In order to more fully understand the techniques in ion implantation and the ion distribution profiles that may be generated, one may refer to the text entitled *VLSI Technology*, edited by S. M. Sze, and published by McGraw-Hill Book Company, and in particular, chapter 6 of said text.

SUMMARY OF THE INVENTION

The present invention contemplates a method for generating an electrical field at a surface of a semiconductor device wherein ions are implanted using a high implantation energy equal to or greater than 100 keV to generate a sharp implant distribution profile, which is highly desirable. However, the electric field developed by high energy implantation is disposed at a depth greater than that which is desirable. This difficulty is uniquely overcome by using a post-implant/activation chemi-mechanical thinning technique used to remove a portion of the silicon from the surface of the semiconductor device, so that the resulting surface is adjacent the maximum implant concentration.

The method is particularly useful in preparing charge-coupled devices, since it can uniquely provide a steep ion distribution profile having a maximum concentration occurring at a rear surface of the silicon. The ion distribution generates a potential that pushes the photo-induced electrons forward towards the potential wells at the front side of the charge-coupled device. Using this technique, substantially all photo-induced electrons are pushed towards the pixel wells, even electrons induced by UV penetration depths as short as 55Å.

A primary objective of the present invention is to provide a semiconductor device having an electrical field developed by implanted ions located substantially at a surface of the device.

DETAILED DESCRIPTION OF THE INVENTION

Figure 1A:
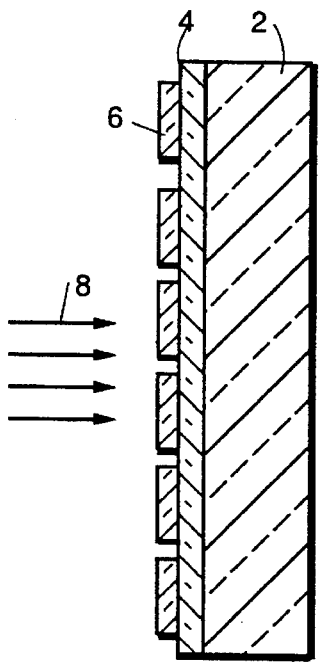
FIGS. 1A and 1B are cross-sectional views of thick and thinned charge-coupled devices, respectively.
Figure 1B:
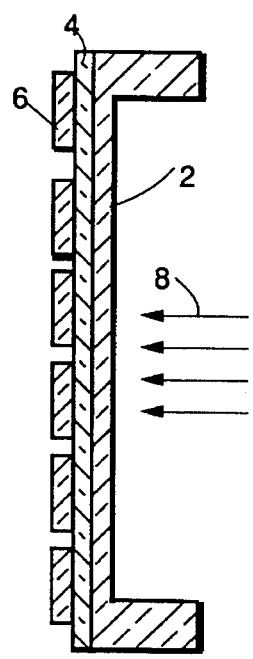

The invention will be described in relation to the preparation of a charge-coupled imaging device; however, it is applicable to other types of devices, particularly the preparation of solar cells.

A standard, commercially-available charge-coupled imaging device, such as the FA1024L Scientific Imager sold by Ford Aerospace, now Loral, is obtained in wafer form and is thinned to remove silicon from the rear surface using a thinning technique as described in co-pending commonly-assigned U.S. patent application Ser. No. 07/670,841, now U.S. Pat. No. 5,162,251 filed on even date herewith and entitled, "Method for making thinned charged-coupled devices."

Using the method taught in the co-pending application, the devices contained on the wafer are first tested to identify properly operating devices, after which the wafer is diced to provide individual dies, each consisting of one charge-coupled device. The individual dies are mounted to a glass substrate, as described in detail in the co-pending application. The device is then thinned, using a two-step chemi-mechanical thinning technique, including a grinding step performed with a lapper, followed by a polishing step, so that the device has a thickness of approximately 10 um. After the device is thinned using the technique of the co-pending application, and prior to a bonding pad exposure step of the co-pending application, the charge-coupled device is implanted with boron to form an electrical field for driving free electrons towards the pixel wells.

The ion implantation techniques used to practice the present invention are standard techniques described in the afore-mentioned text. The rear surface of a thinned charge-coupled device is implanted with boron at an ion beam energy level of between 100–150 keV. The ion beam is adjusted so that implantation is at a beam angle of about 7°. The ion implantation yields a boron concentration of between $1 \times 10^{19}$–$1 \times 10^{20}$ boron atoms per cubic centimeter of silicon.

The ion beam angle range is typically from 0° to 7°. For implantation into <100> silicon, where the atomic crystal density is lowest, maximum ion interaction with the silicon atoms is achieved and the concentration maximum is kept shallow.

The boron is then incorporated into the silicon matrix by laser activation using an excimer laser at 248 nm with a beam energy at the silicon surface of 560 mJ/cm$^2$. For full implant activation, about 20 laser pulses are required. Other activation wavelengths can be used. However, greatest thermal anneal efficiency will result at a wavelength for which there is maximum interaction with the silicon and results in the greatest temperature increase. For silicon this wavelength is about 280 nm; however, 500 nm could be used. The power level used must be above the activation threshold of 400 mJ/cm$^2$ but below the silicon damage threshold of 700 mJ/cm$^2$.

Higher ion beam energies, up to approximately 160 keV, increase the narrowness of the implant distribution at the expense of a deeper distribution profile. Since the laser anneal will result in a broadening of the distribution, the highest ion beam energy practical is desired to have a narrow profile after annealing and skimming.

After the implantation procedure, the device is then ready for the skimming operation of the present invention. The skimming operation takes place using the identical polishing technique described in the co-pending application, wherein the device is mounted in a lapping machine and is lapped using a Nalco colloidal silica abrasive with an 80 nm grit on a urethane polishing pad, and a Pyrex ring in the lapping machine to control the lapping process. In the procedure of the copending application, the silicon removal rate is approximately 9 um/hour, or 0.15 um per minute. For the present invention, the load exerted by the lapping machine is reduced, so that the removal rate is approximately 0.05 um/minute, thereby providing sufficient control to easily and precisely remove silicon with an accuracy to ±0.025 um, which equates to ±250Å.

Using this technique, removal of all of the silicon between the back surface and the implant concentration maximum is practical. It has been discovered that even if a small excess, such as 250Å, of the implanted silicon is removed, the implant concentration maximum and electrical potential field maximum will still be at the new back side surface. Removing a slight excess of the implanted back side silicon will ensure that the highest electrical potential occurs at the back side surface, and that all photo-electrons, regardless of the penetration depths, will be driven forward to the pixel wells of the charge-coupled device.

Figure 2:
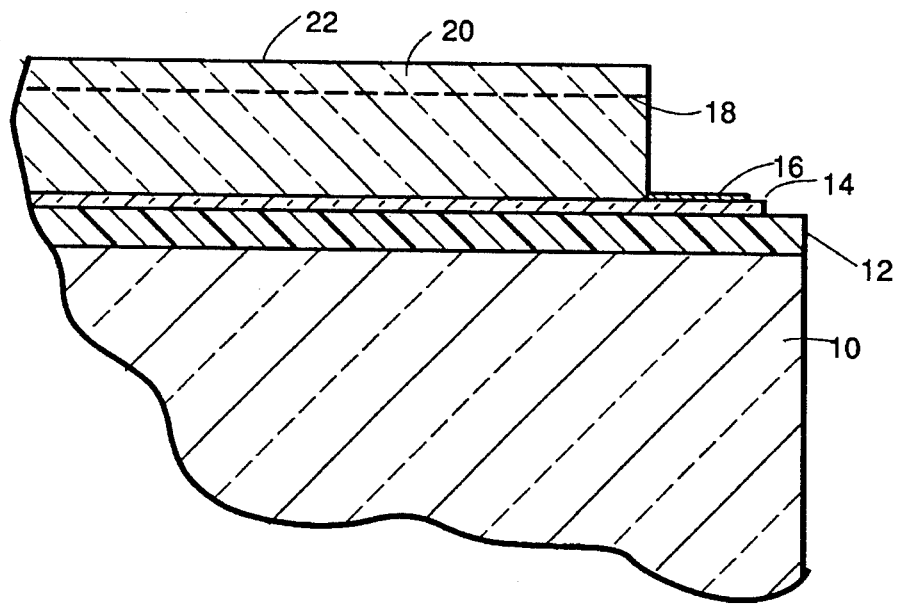
FIG. 2 is a partial cross-section of a device constructed using the present invention.

After application of the skimming technique, the charge-coupled device is further processed, as described in the co-pending application, so that the aluminum bonding pads are exposed. After the aluminum bonding pads have been exposed, the device appears as shown partially in cross-section in FIG. 2. The structure includes a glass substrate 10, an epoxy layer 12, a layer of silicon 14 in which the potential wells of the charge-coupled device are formed, exposed aluminum bonding pads 16 and the remainder of the thinned silicon body 18. A region 20 contains implanted ions for establishing an electrical field at a rear surface 22. The device may then be mounted in a package, with the aluminum bonding pads wire-bonded to the package contact pins.

Thus, the above-described procedure uniquely provides a charge-coupled imaging device having significantly improved quantum efficiency. The improved quantum efficiency is realized by developing a sharp implant distribution profile which is uniquely located at the rear silicon surface, so that all free electrons are driven to the front surface and the pixel wells.

What is claimed is:

1. A method of preparing a thinned charge-coupled imaging device, comprising the steps of:

providing a charge-coupled imaging device having a back surface and a gate structure formed on a front surface;

implanting dopant ions of a selected element into the back surface using an ion beam energy of at least 100 keV to form a buried region of concentrated dopant atoms having a sharp implant distribution profile; and removing silicon from the back surface until a maximum dopant ion concentration is established in the device substantially at the back surface.

2. A method as described in claim 1, wherein the ion beam energy is in the range of 100–150 keV.

3. A method as described in claim 1, wherein the ions are implanted using an ion beam angle of approximately 7°.

4. A method as described in claim 1, wherein the selected element is boron.

5. A method as described in claim 4, wherein the boron concentration is established in a range between $1 \times 10^{19} - 1 \times 19^{20}$ boron atoms per cubic centimeter of silicon.

6. A method as described in claim 1, additionally comprising the step of incorporating the dopant ions into the silicon matrix using laser activation.

7. A method as described in claim 4, wherein the laser activation is achieved using a laser at approximately 248 nm wavelength and a beam energy at the silicon surface of between 400 and 700 mJ/cm$^2$.

8. A method as described in claim 1, wherein the step of removing silicon is achieved by polishing the back surface using a colloidal silica abrasive.

9. A method as described in claim 8, wherein the polishing step removes silicon at a rate of approximately 0.05 um/minute.

* * * * *